(12) United States Patent
Hermes et al.

(10) Patent No.: US 6,486,060 B2
(45) Date of Patent: *Nov. 26, 2002

(54) LOW RESISTANCE SEMICONDUCTOR PROCESS AND STRUCTURES

(75) Inventors: Michael J. Hermes, Boise, ID (US); Kunal R. Parekh, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,639

(22) Filed: Sep. 3, 1998

(65) Prior Publication Data

US 2002/0001875 A1 Jan. 3, 2002

(51) Int. Cl.$^7$ .......................................... H01L 21/4763
(52) U.S. Cl. ....................... 438/649; 438/586; 438/664
(58) Field of Search ................................. 438/618, 586, 438/649, 651, 664, 675, 592, 594, 597, 625, 630, 637, 639, 647, 655, 657, 660, 682–4

(56) References Cited

U.S. PATENT DOCUMENTS

| | | | | |
|---|---|---|---|---|
| 5,198,384 A | | 3/1993 | Dennison et al. | 437/47 |
| 5,381,302 A | | 1/1995 | Sandhu et al. | 361/305 |
| 5,422,296 A | * | 6/1995 | Lage | 437/52 |
| 5,536,683 A | * | 7/1996 | Lin et al. | 437/200 |
| 5,854,127 A | * | 12/1998 | Pan | 438/629 |
| 5,899,742 A | * | 5/1999 | Sun | 438/682 |
| 5,998,257 A | | 12/1999 | Lane et al. | 438/253 |
| 6,013,547 A | * | 1/2000 | Liaw | 438/238 |
| 6,096,638 A | * | 8/2000 | Matsubara | 438/649 |
| 6,175,146 B1 | | 1/2001 | Lane et al. | 257/635 |
| 6,261,899 B1 | | 7/2001 | Lane et al. | 438/253 |

* cited by examiner

Primary Examiner—Eddie Lee
Assistant Examiner—Ginette Peralta

(57) ABSTRACT

A process for forming a semiconductor device comprises the steps of providing a semiconductor substrate assembly comprising a semiconductor wafer having an active area formed therein, a plurality of transistor gates each having a TEOS cap thereon and a pair of nitride spacers along each gate, a plurality of conductive plugs each contacting the wafer, and a BPSG layer overlying the transistor gates and contacting the active area. A portion of the BPSG layer is etched thereby exposing the TEOS caps. A portion of the BPSG layer remains on the active area after completion of the etch. Subsequently, a portion of the TEOS caps are removed to expose the transistor gates and a titanium silicide layer is formed simultaneously to contact the transistor gates and the plugs. An inventive structure resulting from the inventive process is also described.

16 Claims, 3 Drawing Sheets

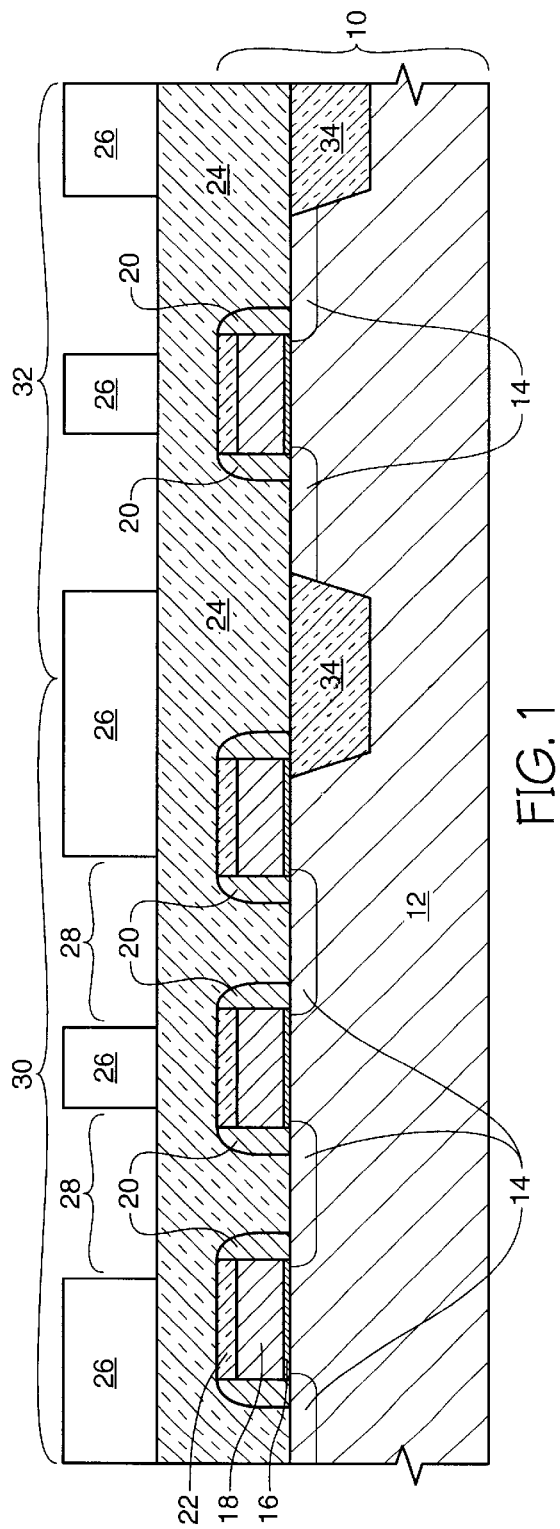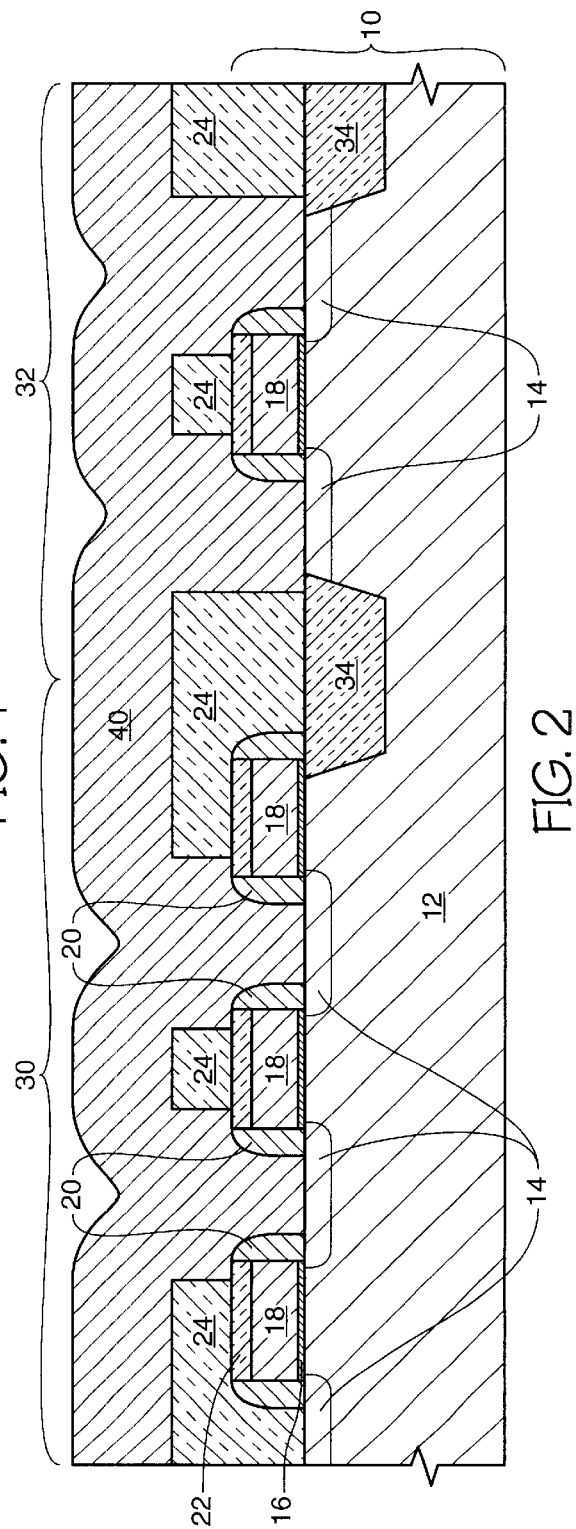

US 6,486,060 B2

LOW RESISTANCE SEMICONDUCTOR PROCESS AND STRUCTURES

FIELD OF THE INVENTION

This invention relates to the field of semiconductor assembly, and more particularly to a process for forming conductive structures having enhanced conductivity, and the in-process structure resulting from the process.

BACKGROUND OF THE INVENTION

Structures such as polycrystalline silicon (poly) plugs, interconnects, and transistor gates are commonly formed during the manufacture of semiconductor devices such as microprocessors, memory devices, and logic devices. To manufacture a plug, for example, a masked dielectric layer is formed over an underlying substrate assembly and an etch is completed to form a hole in the dielectric which exposes the underlying structure in the area where contact is to be made. A blanket poly layer is deposited over the dielectric layer which fills the hole in the dielectric layer and contacts the underlying structure. The poly is then removed from a planar surface of the dielectric, typically using a chemical mechanical polishing (CMP) process which leaves the plug formed within the dielectric layer. Interconnects and gates are typically formed by depositing a blanket layer of poly over a semiconductor substrate assembly, then masking and etching the layer.

As the sizes of the plugs and line widths decrease with improving manufacturing technology, the doped poly structure may provide excessive resistance and insufficient conductance. To reduce the resistance of a structure, a silicide layer is often formed underneath the plug or over the top of the plug, gate or interconnect. To form the silicide layer to enhance plug conductivity the silicide layer can be formed before formation of the plug. A titanium chemical vapor deposition (CVD) process results in titanium reacting with the exposed silicon wafer to form titanium silicide. An unreacted titanium metal layer will also form over any exposed dielectric layer which is then stripped. After stripping the unreacted titanium, the poly plugs are formed over the silicide layer as described above.

A silicide layer can also be formed over the plug, transistor gate or other interconnect after forming the blanket poly layer which forms the gate or interconnect. During a titanium CVD process similar to that described above for forming silicide under the plug, the titanium reacts with the polysilicon to form silicide on top of the poly layer, then the poly is masked and etched to define the line or plug.

U.S. Pat. No. 5,381,302 by Sandhu et al. and U.S. Pat. No. 5,198,384 by Dennison, each assigned to Micron Technology, Inc. and incorporated herein by reference in their entirety, describe a process for forming a silicide layer over a poly plug.

While the silicide layer interposed between the silicon wafer and the poly plug provides decreased resistance and increased conductance it can also provide a path for leakage between an adjacent transistor channel region and an active area, thereby increasing junction leakage. A process and structure which provides improved conductance and reduced resistance and which does not increase junction leakage would be desirable. It would be further desirable to provide a plug having a maximized amount of silicide formed thereon.

SUMMARY OF THE INVENTION

The present invention provides a new process and structure having fewer problems associated with the formation of silicided polycrystalline silicon plugs, particularly problems resulting in excessive transistor junction leakage. In accordance with one embodiment of the invention, a semiconductor substrate assembly is provided which comprises a semiconductor wafer, a plurality of transistor gates, and a plurality of conductive plugs which contact the wafer. A silicide layer is formed which simultaneously forms to contact the plurality of gates and the plurality of plugs. In another embodiment, a plug is formed which comprises silicide on the sidewalls, thereby maximizing the amount of the desirable silicide to minimize resistance.

Objects and advantages will become apparent to those skilled in the art from the following detailed description read in conjunction with the appended claims and the drawings attached hereto.

BRIEF DESCRIPTION OF THE DRAWINGS

FIG. 1 is a cross section depicting a plurality of transistor gates formed over a doped semiconductor wafer, and further depicts a plurality of dielectric layers and a mask formed thereover;

FIG. 2 is a cross section of the FIG. 1 structure after patterning the planar dielectric layer and forming of a blanket conductive layer;

Figure 3:
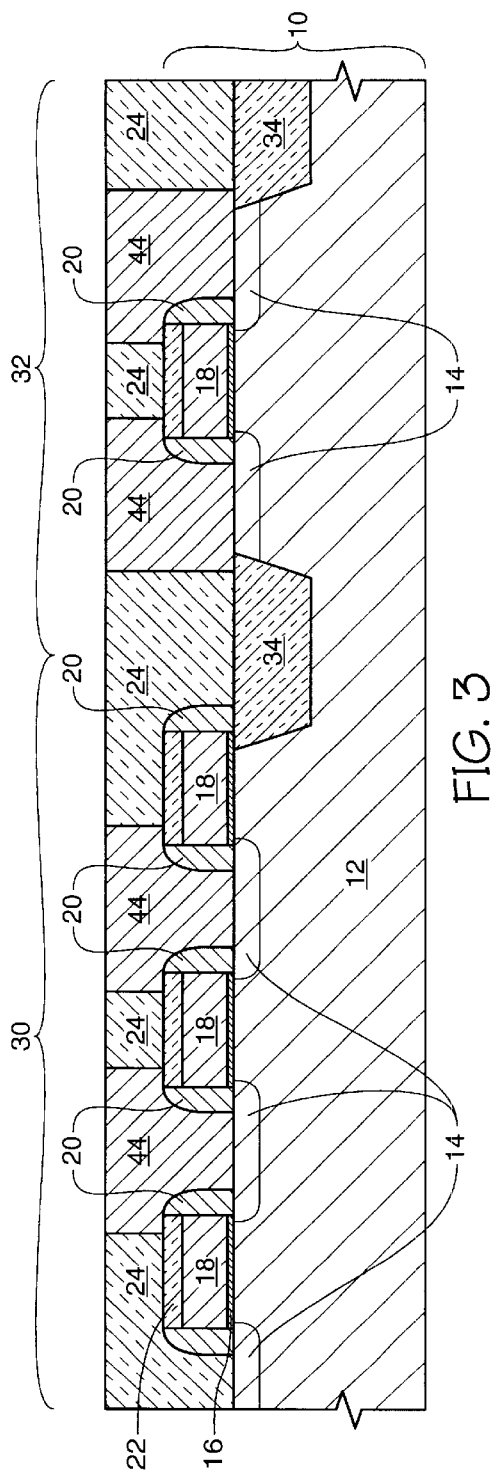
FIG. 3 is a cross section of the FIG. 2 structure after planarizing the conductive layer to form a plurality of plugs.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A first embodiment of an inventive process used during the formation of a semiconductor device is depicted in FIGS. 1–5. FIG. 1 depicts a wafer substrate assembly 10 including a semiconductor wafer 12 having doped regions (active areas) therein 14, at least one transistor, and preferably a plurality of transistors, with each transistor comprising gate oxide 16 and a conductive transistor control gate portion 18. Each transistor further comprises dielectric spacers 20, for example formed from silicon nitride, and a capping layer 22, for example formed from tetraethyl orthosilicate (TEOS) or another undoped silicon dioxide layer. A TEOS layer from about 300 Å to about 800 Å thick would be sufficient.

FIG. 1 further includes a planar dielectric layer 24, for example a borophosphosilicate glass (BPSG) layer from about 4,000 Å to about 8,000 Å thick, having a mask 26 formed thereupon. Alternatively, borosilicate glass (BSG), phosphosilicate glass (PSG), or another doped silicon dioxide layer may be used. The mask layer leaves various areas of the BPSG exposed 28, for example regions between various transistors, and areas between a transistor array 30 and a periphery 32 of a semiconductor device as depicted. A shallow trench isolation area 34 separates the array 30 from the periphery. Next, the exposed BPSG 24 is removed using an etch selective to the TEOS caps 22 and nitride spacers 20 (i.e. an etch which minimizes etching of TEOS and nitride and maximizes etching of BPSG). The exposed BPSG is removed to expose the underlying layer (in the instant case, the silicon wafer 12) as depicted in FIG. 2. A wet etch such as a hydrofluoric acid (HF) dip, or a dry etch would remove the BPSG selective to nitride and TEOS.

Regarding the dry (plasma) BPSG etch selective to nitride and TEOS, one factor that affects the etch rate and the etch selectivity of the process is pressure. The total pressure has a preferred range of from about 1 millitorr to about 400 millitorr. A more preferred pressure range for a plasma etch is in a pressure range of from about 1 millitorr to about 100 millitorr. The most preferred pressure range for a plasma etch is from about 1 millitorr to about 75 millitorr. The pressure may be increased, however, above the most preferred ranges. For example the RIE etch may be performed at about 100 millitorr. Selectivity of the BPSG to the TEOS and nitride can be optimized at a pressure range between about 10 millitorr and about 75 millitorr. Pressure increases may result in a loss in selectivity. The range in selectivity, however, can be adjusted to accommodate different pressures. As such, selectivity and pressure are inversely related. Temperature is another factor that affects the selectivity of the etching process used. A preferable temperature range of the reactor cathode during the plasma etch has a range of about 10° C. to about 80° C., and more preferably about 20° C. to about 40° C. This is the temperature of a bottom electrode adjacent to the semiconductor substrate 12 during the etching process. The preferable range of the semiconductor materials is between about 40° C. and about 120° C., and more preferably between about 40° C. and about 90° C.

Undoped silicon dioxide layer 22 and nitride spacers 20 seen in FIGS. 1 and 2 protect underlying layers from the fluorinated chemical etch. As illustrated in FIG. 2, the etch will anisotropically remove the exposed portions 28 of doped BPSG layer 24. The etch removes material from the BPSG layer 24 at a higher material removal rate than that of undoped TEOS layer 22 and nitride. spacers 20. Preferably, the etch has a material removal rate for substantially doped silicon dioxide (BPSG 24) that is at least 10 times higher than that of substantially undoped silicon dioxide (TEOS 22) or silicon nitride 20.

Preferably, etching as conducted according to this invention involves an anisotropic plasma etch with a fluorinated chemistry that etches through BPSG (or BSG or PSG or doped silicon dioxide in general). The etch is preferably selective to undoped silicon dioxide, silicon, and silicon nitride. The fluorinated chemical etch uses a type of carbon fluorine gas that is preferably selected from the group consisting of $C_2F_6$, $CF_4$, $C_3F_8$, $C_4F_{10}$, $C_2F_8$, $CH_2F_2$, $CHF_3$, $C_2HF_5$, $CH_3F$ and combinations thereof. There are other fluorinated etchants in a substantially gas phase that can be employed during the etching of the structure. An inert gas is often used in combination with the fluorinated etchant. Argon, nitrogen, and helium are examples of such an inert gas. The preferred gases, however, are $CF_4$, $CH_2F_2$, $CHF_3$ and Ar. Alternatively, $CH_3F$ may be used in place of $CH_2F_2$. In particular, the preferred etchant is a fluorine deficient gas which is defined as a gas where there are not enough fluorine atoms to saturate the bonding for the carbon atoms.

Next, as depicted in FIG. 2, a blanket layer of polycrystalline silicon 40 (poly) from about 1,000 Å to about 4,000 Å thick is formed over the wafer substrate assembly 10 to contact the silicon wafer 12. The poly 40 and, optionally, the BPSG 24 are planarized to remove the poly 40 from horizontal surfaces of the BPSG layer 24, for example using chemical mechanical planarization (CMP) to result in the structure of FIG. 3 having poly plugs 44 which contact the silicon wafer 12. The plugs as depicted comprise a horizontal top and a substantially vertical sidewall which intersect at about 90°.

Figure 4:
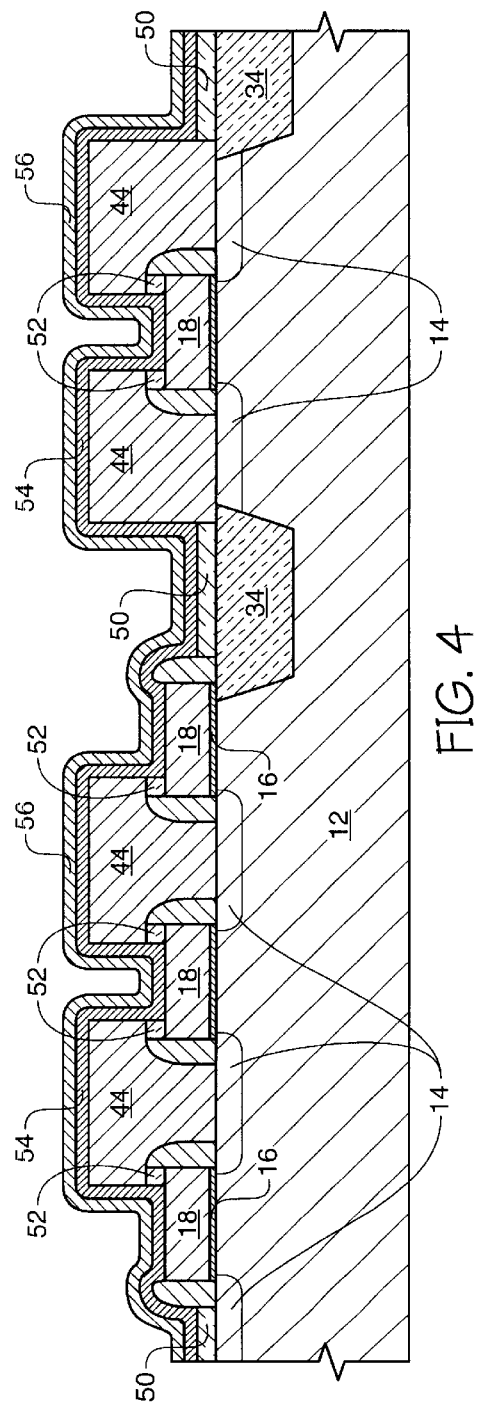
FIG. 4 is a cross section of the FIG. 3 structure after etching the planar dielectric and after forming a refractory metal layer (which forms silicide on the conductive layer) and a protective dielectric layer over the titanium layer.

Subsequently, the BPSG 24 is removed, for example using an HF dip, to expose the TEOS caps 22 from the transistor gates 18, but a portion of the BPSG 50 remains over the areas where the BPSG contacts the wafer as depicted in FIG. 4. Further, the exposed TEOS 22 is etched from the transistor gates 18 to expose the poly gates 18, for example using tetramethylammonium hydroxide (TMAH) and;HF. Alternately, the BPSG and TEOS can be removed using a single etch which is selective to nitride and poly. A wet etch, for example using TMAH/HF, SuperQ (3% phosphoric acid, 37% ammonium fluoride), QEtch II (1% phosphoric acid, 39% ammonium fluoride), or a dry etch, for example using $CHF_3$, $CF_4$, or Argon would be sufficient. A portion of the TEOS 52 may remain, which is dependent on the alignment of the mask 26 in FIG. 1. The removal of the BPSG 24 between FIGS. 3 and 4 requires no mask, but the etch must be timed to clear the BPSG 24 from the TEOS caps 22 but to leave a portion of the BPSG 50 where the BPSG contacts the semiconductor wafer 12. Further, the TEOS 22 must be cleared to expose the gates 18.

A blanket refractory metal layer such as titanium, chromium, tantalum, platinum, tungsten, zirconium, and molybdenum, and preferably a titanium layer 54 from about 100 Å to about 400 Å thick is formed over the exposed surfaces of the assembly as depicted in FIG. 4. This includes forming the titanium over poly 18 and wafer 12 and over various dielectrics 20, 50 as depicted. A CVD deposition of titanium can be performed at a temperature between about 400° C. and 700° C. using $TiCl_4$ as a source. Using this process the titanium reacts with exposed silicon structures and remains unreacted over the dielectric structures. Next, a titanium nitride layer 56 can be formed using a CVD or PVD process to a thickness of between about 100 Å to about 500 Å. A rapid thermal anneal (RTA) step is performed to decrease the resistance of the titanium silicide, for example using a temperature between about 650° C. and about 800° C. for between about 20 seconds to about 90 seconds in a nitrogen ambient. During this step, the TiN protects the silicide from exposure to, and possible reaction with, oxygen.

Finally, the titanium nitride 56 and the unreacted titanium 54 overlying the dielectric is removed, for example using a solution of $NH_4OH$, $H_2O_2$, and water. The remaining exposed BPSG 50 over the active areas are removed using an HF dip to result in the structure of FIG. 5.

Figure 5:
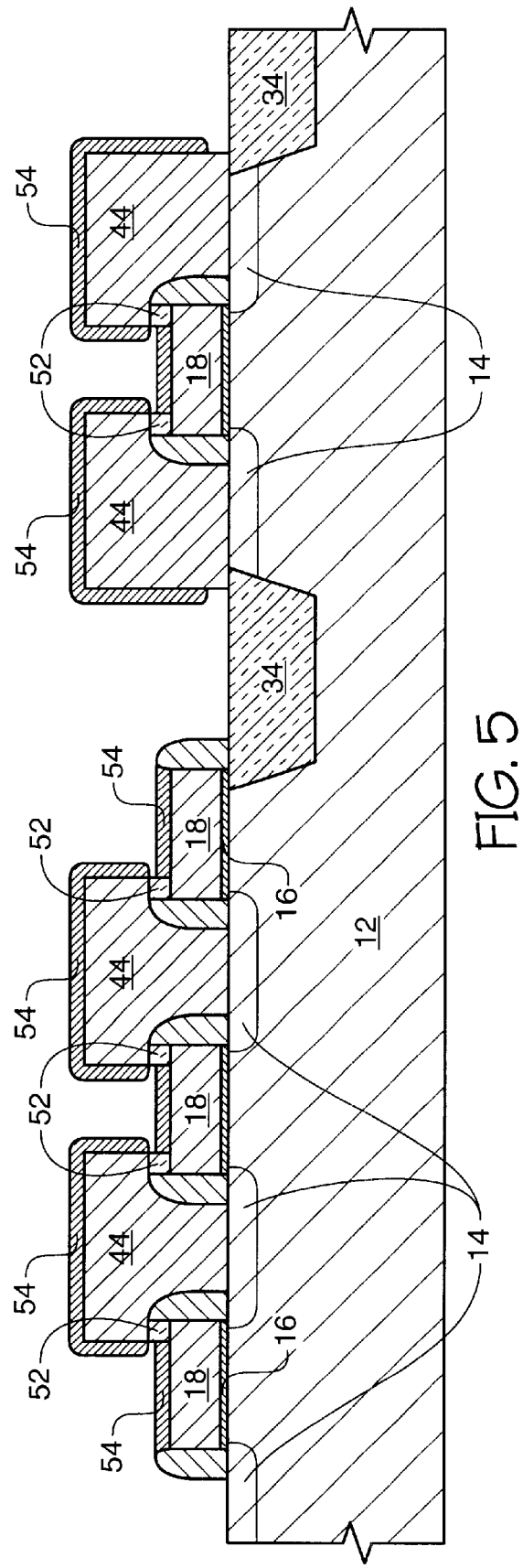
FIG. 5 is a cross section of the FIG. 4 structure after removing the protective dielectric layer and any unreacted refractory metal.

As depicted in FIG. 5, the instant process results in poly plugs 44 or other poly structures having a silicided sidewall. This results in a structure having reduced resistance compared to structures of equal size and shape having silicide only over the upper surface. Further, silicide over two or more types of structures, for example a transistor gate 18 and a poly plug 44, can be formed simultaneously which reduces manufacturing steps compared to processes which form silicide over the gate and over the plug using two or more separate steps.

While this invention has been described with reference to illustrative embodiments, this. description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A process used to manufacture a semiconductor device, comprising:
   providing a semiconductor substrate assembly comprising a semiconductor wafer, a plurality of conductive transistor gate portions, and a plurality of conductive plugs which contact said wafer and are out of contact with said plurality of transistor gate portions; and
   forming a silicide layer which simultaneously forms to contact said plurality of conductive gate portions and said plurality of plugs.

2. The process of claim 1 wherein said providing said semiconductor substrate assembly comprises:
   providing silicon nitride spacers which contact said conductive gate portions;
   providing an undoped silicon dioxide capping layer over and contacting each of said conductive gate portions;
   providing a doped silicon dioxide layer over said spacers and over said capping layer; and
   etching said doped silicon dioxide layer selective to said undoped silicon dioxide layer and to said spacers to expose said semiconductor wafer.

3. The process of claim 1 wherein said plug comprises a top portion and a sidewall, wherein said formation of said silicide layer results in said silicide layer contacting said top portion and said sidewall of said plug.

4. A process used to manufacture a semiconductor device comprising:
   providing a semiconductor substrate assembly comprising a silicon wafer and at least one dielectric layer formed over said wafer;
   removing a portion of said dielectric layer to form a hole therein to expose said silicon wafer;
   forming a polycrystalline silicon structure within said hole and over said semiconductor substrate assembly wherein said polycrystalline silicon structure contacts said silicon wafer;
   subsequent to forming said polycrystalline silicon structure, removing a portion of said dielectric layer to expose a conductive transistor gate portion;
   forming a blanket layer over said substrate assembly wherein said blanket layer comprises a refractory metal layer over said at least one dielectric layer and further comprises a refractory metal silicide layer which contacts said polycrystalline silicon structure and said conductive transistor gate portion; and
   removing said refractory metal layer.

5. The method of claim 4 further comprising reacting said refractory metal layer with said polycrystalline silicon structure and said conductive gate portion to form said refractory metal silicide layer.

6. A process used to manufacture a semiconductor device, comprising:
   providing a semiconductor substrate assembly comprising a semiconductor wafer, a plurality of conductive transistor gate portions formed over said wafer, a first dielectric layer overlying said conductive transistor gate portions, and a second dielectric layer overlying said semiconductor wafer;
   removing a portion of said second dielectric layer to form a hole therein and to expose said semiconductor wafer;
   forming a polycrystalline silicon layer in said hole which contacts said semiconductor wafer;
   subsequent to forming said polycrystalline silicon layer, removing a portion of said first dielectric layer to expose said conductive transistor gate portions, wherein said polycrystalline silicon layer and said conductive transistor gate portions are each exposed; and
   forming a silicide layer which contacts said conductive transistor gate portions and said polycrystalline silicon layer.

7. The process of claim 6 wherein said providing said substrate assembly provides an undoped first dielectric layer and a doped second dielectric layer.

8. A process for forming a semiconductor device, comprising:
   providing a semiconductor substrate assembly comprising a semiconductor wafer having an active area formed therein, a plurality of conductive transistor gate portions each having a TEOS cap thereon and a pair of nitride spacers along each said gate, a plurality of conductive plugs each contacting said wafer, and a BPSG layer overlying said conductive transistor gate portions and contacting said active area;
   etching a portion of said BPSG layer to expose said TEOS caps, wherein a portion of said BPSG layer remains on said active area after completion of said etch;
   removing a portion of said TEOS caps to expose said conductive transistor gate portions; and
   forming a titanium silicide layer simultaneously to contact said conductive transistor gate portions and said plugs.

9. The process of claim 8 wherein said etching of said BPSG layer and said removal of said portion of said TEOS caps are performed using a single etch.

10. The process of claim 8 wherein said etching of said BPSG layer exposes said TEOS caps and said nitride spacers.

11. The process of claim 8 wherein said etching of said BPSG layer results in a layer of BPSG of between about 500 Å and about 4,000 Å remaining over said active area.

12. A process for forming a semiconductor device, comprising:
   providing a semiconductor substrate assembly comprising a semiconductor wafer;
   forming a conductive plug over said assembly, said plug having a sidewall and an upper surface which intersects said sidewall; and
   forming a layer of silicide which contacts said upper surface and said sidewall of said conductive plug.

13. The process of claim 12 further comprising:
   forming a conductive transistor gate portion; and
   forming said layer of suicide to contact said conductive transistor gate portion simultaneously with said formation of said silicide which contacts said upper surface and said sidewall of said conductive plug.

14. A method used during the formation of a semiconductor device, comprising:
   providing a semiconductor substrate assembly comprising a semiconductor wafer having a plurality of polysilicon transistor gates formed thereover, each gate having an associated cap and spacers, said assembly further comprising a planar dielectric layer formed over said gates and over said semiconductor wafer;
   etching said planar dielectric layer to form a plurality of openings therein;
   forming a polysilicon plug layer within said openings;
   planarizing said polysilicon plug layer and said dielectric layer simultaneously;

subsequent to said planarization of said dielectric layer, removing said dielectric layer to expose a portion of each said cap;

removing a portion of each said cap to expose said polysilicon transistor gate associated therewith;

forming a blanket conductive layer to contact said planarized plug layer, each said exposed polysilicon transistor gate, and at least one of said cap and said spacers associated with each said exposed polysilicon transistor gate;

processing said blanket conductive layer to react said blanket conductive layer with said polysilicon gates and with said polysilicon plug layer, wherein said portion of said conductive layer which contacts said at least one of said cap and said spacers remains unreacted; and removing said portion of said conductive layer which remains unreacted subsequent to said processing of said blanket conductive layer.

15. The method of claim 14 wherein:

said formation of said blanket conductive layer comprises forming a refractory metal layer; and said processing of said blanket conductive layer occurs during said formation of said refractory metal layer and forms a refractory metal silicide which contacts said polysilicon plug layer and said polysilicon transistor gates.

16. The method of claim 15 further comprising:

forming a titanium nitride layer over said blanket conductive layer; and heating said blanket conductive layer to a temperature of between about 650° C. and about 800° C. for between about 20 seconds to about 90 seconds in a nitrogen ambient subsequent to said formation of said titanium nitride layer and prior to said removal of said unreacted blanket conductive layer.

* * * * *